US012679719B2

(12) United States Patent
Chen et al.

(10) Patent No.: US 12,679,719 B2
(45) Date of Patent: Jul. 14, 2026

(54) MEMS STRUCTURE

(71) Applicant: Fortemedia, Inc., Santa Clara, CA (US)

(72) Inventors: Jien-Ming Chen, Tainan City (TW);
Wen-Shan Lin, Tainan City (TW);
Chun-Kai Mao, Tainan City (TW);
Feng-Chia Hsu, Tainan City (TW);
Chih-Yuan Chen, Tainan City (TW);
Nai-Hao Kuo, Tainan City (TW)

(73) Assignee: FORTEMEDIA, INC., Santa Clara, CA (US)

( * ) Notice: Subject to any disclaimer, the term of this patent is extended or adjusted under 35 U.S.C. 154(b) by 663 days.

(21) Appl. No.: 17/817,151

(22) Filed: Aug. 3, 2022

(65) Prior Publication Data

US 2023/0339742 A1　　Oct. 26, 2023

Related U.S. Application Data

(60) Provisional application No. 63/333,580, filed on Apr. 22, 2022.

(51) Int. Cl.
B81B 3/00 (2006.01)

(52) U.S. Cl.
CPC .... B81B 3/0021 (2013.01); *B81B 2201/0257* (2013.01); *B81B 2203/0127* (2013.01); *B81B 2203/0353* (2013.01); *B81B 2203/04* (2013.01); *B81B 2203/051* (2013.01)

(58) Field of Classification Search
CPC .......... H81B 3/0021; B81B 2201/0257; B81B 2201/003; B81B 2203/0127; B81B 2203/0353; B81B 2203/04; B81B 2203/051; H04R 2201/003; H04R 19/04
See application file for complete search history.

(56) References Cited

U.S. PATENT DOCUMENTS

| | | | | |
|---|---|---|---|---|
| 2020/0339411 A1* | 10/2020 | Chen | ...................... | H04R 7/18 |
| 2020/0369511 A1* | 11/2020 | Lin | .................... | H04R 31/003 |
| 2021/0136483 A1* | 5/2021 | Hsieh | .................... | H04R 19/04 |
| 2022/0038826 A1* | 2/2022 | Lee | .................... | H04R 19/005 |
| 2023/0010887 A1* | 1/2023 | Kwack | .................. | H04R 19/04 |
| 2023/0164495 A1* | 5/2023 | Zhao | ...................... | H04R 7/18 |
| | | | | 381/174 |
| 2023/0179928 A1* | 6/2023 | Jung | .................... | B81B 3/007 |
| | | | | 381/174 |

FOREIGN PATENT DOCUMENTS

CN　　　　212259332 U　 *　12/2020

OTHER PUBLICATIONS

Chinese language office action dated Mar. 21, 2026, issued in application No. CN 202211663419.6.

* cited by examiner

*Primary Examiner* — Fernando L Toledo
*Assistant Examiner* — Marshall Mu-Nuo Hatfield
(74) *Attorney, Agent, or Firm* — McClure, Qualey & Rodack, LLP

(57) ABSTRACT

A MEMS structure is provided. The MEMS structure includes a substrate having an opening portion and a backplate disposed on one side of the substrate and having acoustic holes. The MEMS structure also includes a diaphragm disposed between the substrate and the backplate and extending across the opening portion of the substrate. The diaphragm includes ventilation holes, and an air gap is formed between the diaphragm and the backplate. The MEMS structure further includes a coverage structure disposed on the sidewall of at least one ventilation hole.

18 Claims, 15 Drawing Sheets

14

D $14A \begin{cases} 14A1 \\ 14A2 \end{cases}$

14A2

14A1

C

14A2

14A1

16

14

E $14A \begin{cases} 14A1 \\ 14A2 \end{cases}$

14A2

14A1

C

14A2

14A1

16

MEMS STRUCTURE

CROSS REFERENCE TO RELATED APPLICATIONS

This application claims the benefit of U.S. Provisional Application No. 63/333,580, filed on Apr. 22, 2022, the entirety of which is incorporated by reference herein.

BACKGROUND

Technical Field

Embodiments of the present disclosure relate in general to an acoustic transducer, and in particular they relate to a micro-electro-mechanical system (MEMS) structure that may be used in a micro-electro-mechanical system microphone.

Description of the Related Art

The current trend in personal electronics is toward fabricating slim, compact, lightweight and high-performance electronic devices, including microphones. A microphone is used to receive sound waves and convert acoustic signals into electric signals. Microphones are widely used in daily life and are installed in such electronic products as telephones, mobiles phones, and recording pens. In a capacitive microphone, variations in acoustic pressure (i.e., local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting the voltage difference caused by the capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Although existing MEMS microphones have generally been adequate for their intended purposes, they have not been entirely satisfactory in all respects. For example, the specifications of high-end microphones not only include signal-to-noise ratio (SNR) and acoustic overload point (AOP) performance requirements, but also the need to meet low-frequency roll off (LFRO) requirements. In addition, the phase mismatching between different MEMS microphones also needs to be minimized.

SUMMARY

The micro-electro-mechanical system (MEMS) structure in the present disclosure may be used in a micro-electro-mechanical system microphone, which includes a coverage structure disposed the sidewall of at least one ventilation hole. In some embodiments, the coverage structure forms a slit in the corresponding ventilation hole, which may increase the acoustic resistance, thereby enhancing the signal-to-noise ratio (SNR). Furthermore, the gap may reduce the variation size of fabrication, thereby decreasing the phase mismatching between MEMS microphones.

Some embodiments of the present disclosure include a MEMS structure. The MEMS structure includes a substrate having an opening portion and a backplate disposed on one side of the substrate and having acoustic holes. The MEMS structure also includes a diaphragm disposed between the substrate and the backplate and extending across the opening portion of the substrate. The diaphragm includes ventilation holes, and an air gap is formed between the diaphragm and the backplate. The MEMS structure further includes a coverage structure disposed on the sidewall of at least one ventilation hole.

In some embodiments, the coverage structure forms a slit in the corresponding ventilation hole.

In some embodiments, the width of the slit is smaller than 0.4 µm.

In some embodiments, from a top view of the diaphragm, the ventilation holes are arranged in a plurality of ring shapes and surround the center of the diaphragm.

In some embodiments, the ventilation holes are divided into first ventilation holes and second ventilation holes arranged in a concentric manner.

In some embodiments, the first ventilation holes and the second ventilation holes are staggered relative to the center of the diaphragm.

In some embodiments, the first ventilation holes are disposed between the center of the diaphragm and the second ventilation holes in a radial direction of the diaphragm.

In some embodiments, the number of first ventilation holes is different from the number of second ventilation holes.

In some embodiments, each first ventilation hole has a different size from each second ventilation hole.

In some embodiments, the ventilation holes are further divided into third ventilation holes, and the second ventilation holes are disposed between the first ventilation holes and the third ventilation holes in the radial direction of the diaphragm.

In some embodiments, the ventilation holes are C-shaped, stripe-shaped, or curved.

In some embodiments, the width of the coverage structure is less than half of the thickness of the diaphragm.

In some embodiments, the ventilation holes are arranged adjacent to the center of the diaphragm or on the periphery of the diaphragm.

In some embodiments, the width of the top of the coverage structure is different from the width of the bottom of the coverage structure.

In some embodiments, the coverage structure covers a portion of the sidewall of the ventilation hole, and exposes another portion of the sidewall of the ventilation hole.

In some embodiments, the top surface of the coverage structure is lower than the top surface of the diaphragm.

In some embodiments, the MEMS structure further includes a pillar disposed between the backplate and the diaphragm.

In some embodiments, the pillar is disposed on the center of the diaphragm.

In some embodiments, the pillar and the diaphragm are separable.

In some embodiments, the coverage structure is made of a different material than the diaphragm.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
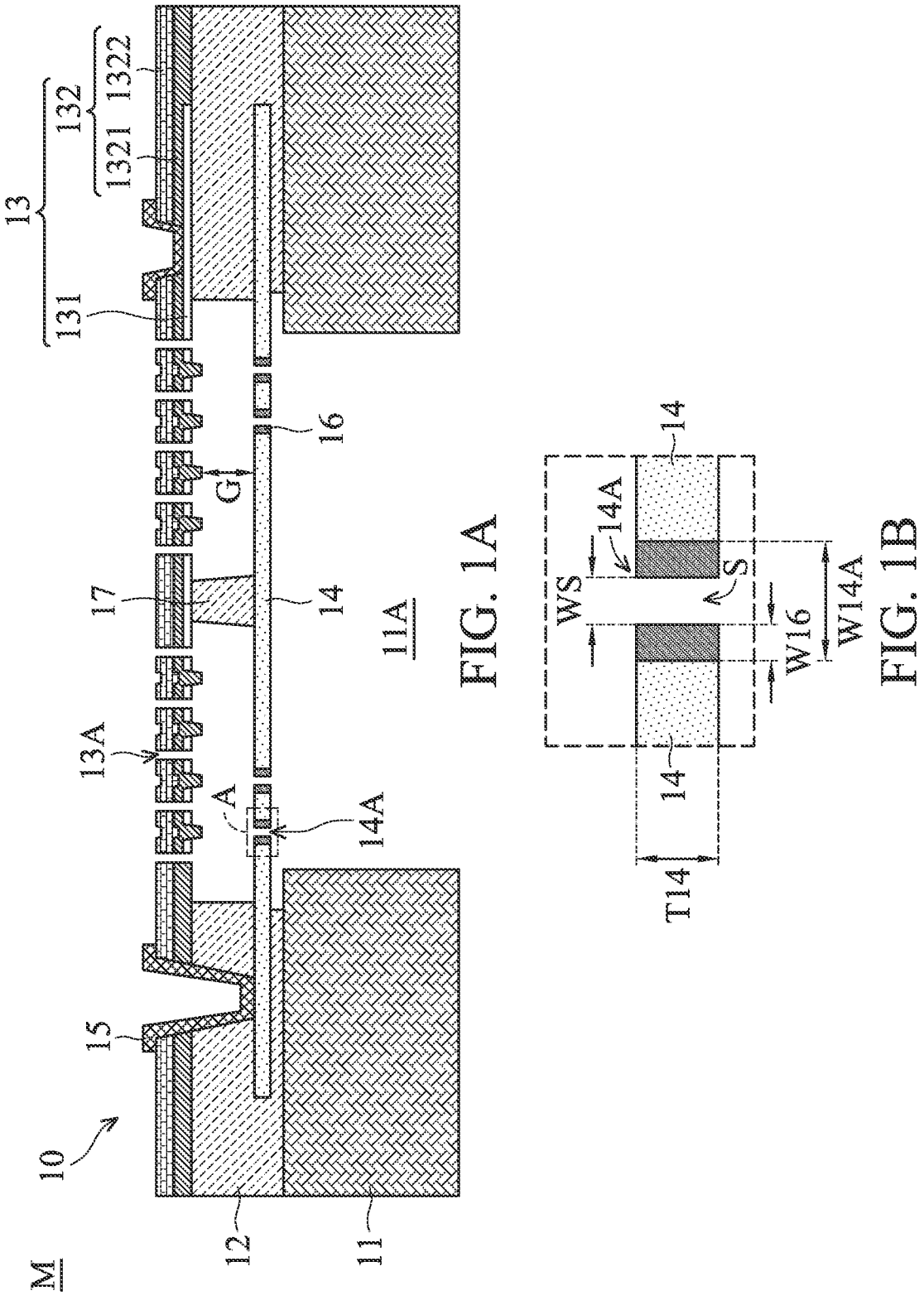
FIG. 1A is a partial cross-sectional view illustrating a micro-electro-mechanical system (MEMS) microphone according to some embodiments of the present disclosure.
FIG. 1B is a partial enlarged view of region A in FIG. 1A, which may show a portion of the diaphragm and a portion of the coverage structure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1A is a partial cross-sectional view illustrating a micro-electro-mechanical system (MEMS) microphone M according to some embodiments of the present disclosure. For example, the MEMS microphone M may be a capacitive microphone. As shown in FIG. 1A, the MEMS microphone M includes a MEMS structure 10. In some embodiments, the MEMS structure 10 includes a substrate 11, a dielectric layer 12, a backplate 13, a diaphragm 14, and an electrode layer 15. It should be noted that some components of the MEMS microphone M (MEMS structure 10) have been omitted in FIG. 1A for sake of brevity.

The substrate 11 is configured to support the dielectric layer 12, the backplate 13, the diaphragm 14, and the electrode layer 15 on one side of the substrate 11. As shown in FIG. 1A, in some embodiments, the substrate 11 has an opening portion 11A. The opening portion 11A allows sound waves received by the MEMS microphone M to pass through and/or enter the MEMS structure 10. For example, the substrate 11 may include silicon or the like, but the present disclosure is not limited thereto.

The dielectric layer 12 is disposed between the substrate 11 and the diaphragm 14, and between the diaphragm 14 and the backplate 13. In other words, the diaphragm 14 is inserted in the dielectric layer 12, so as to provide partial isolation between the substrate 11, the diaphragm 14 and, the backplate 13 from each other. Moreover, the dielectric layer 12 is disposed around the backplate 13 and the diaphragm 14, such that the backplate 13 and the diaphragm 14 are supported at their edges by the dielectric layer 12. The dielectric layer 12 may be made of silicon oxide or the like.

The backplate 13 is a stationary element disposed on one side of the substrate 11. The backplate 13 may have sufficient stiffness such that it would not be bending or movable when the sound waves pass through the backplate 13. For example, the backplate 13 may be a stiff perforated element, but the present disclosure is not limited thereto. As shown in FIG. 1, in some embodiments, the backplate 13 includes a number of acoustic holes 13A, and each acoustic hole 13A passes through the backplate 13. The acoustic holes 13A are configured to allow the sound waves to pass through.

As shown in FIG. 1A, the backplate 13 may include a conductive layer 131 and an insulating layer 132 covering the conductive layer 131 for protection. The insulating layer 132 may further include a first insulating layer 1321 and a second insulating layer 1322. As shown in FIG. 1A, the conductive layer 131 may be disposed on the dielectric layer 12, the first insulating layer 1321 may be disposed on the conductive layer 131, and the second insulating layer 1322 may be disposed on the first insulating layer 1321. For example, the conductive layer 131 may include poly-silicon or the like, and the insulating layer 132 (e.g., the first insulating layer 1321 or the second insulating layer 1322) may include silicon nitride or the like, but the present disclosure is not limited thereto. Moreover, the first insulating layer 1321 and the second insulating layer 1322 may include the same material or different materials.

The MEMS structure 10 may be electrically connected to a circuit (not shown) via several electrode pads of the electrode layer 15 that is disposed on the backplate 13 and electrically connected to the conductive layer 131 and the diaphragm 14. For example, the electrode layer 15 may include copper, silver, gold, aluminum, the like, alloy thereof, or a combination thereof.

The diaphragm 14 is disposed between the substrate 11 and the backplate 13, and extends across the opening portion 11A of the substrate 11. The diaphragm 14 is movable or displaceable relative to the backplate 13. The diaphragm 14 is configured to sense the sound waves received by the MEMS microphone M. As shown in FIG. 1A, in some embodiments, the diaphragm 14 includes ventilation holes 14A, and an air gap G is formed between the diaphragm 14 and the backplate 13. The sound waves pass through the diaphragm 14 via ventilation holes 14A to reach the air gap G, and then pass through the backplate 13 via acoustic hole 13A.

In more detail, the displacement change of the diaphragm 14 relative to the backplate 13 causes a capacitance change between the diaphragm 14 and the backplate 13. The capacitance change is then converted into an electric signal by circuitry connected with the diaphragm 14 and the backplate 13, and the electrical signal is sent out of the MEMS microphone M through the electrode layer 15.

On the other hand, in order to increase the sensitivity of the diaphragm 14, a number of ventilation holes 14A may be provided in the diaphragm 14 to reduce the stiffness of the diaphragm 14. In some embodiments, there may be more than two ventilation holes 14A. With this structural feature, high sensitivity of the MEMS microphone M can be achieved. In addition, the ventilation holes 14A in the diaphragm 14 are also configured to relieve the high air pressure on the diaphragm 14.

Referring to FIG. 1A, in some embodiments, the MEMS structure 10 further includes a coverage structure 16 disposed on the sidewall of at least one ventilation hole 14A. In some embodiments, the coverage structure 16 is made of a different material than the diaphragm 14, but the present disclosure is not limited thereto. In some other embodiments, the coverage structure 16 is made of the same material as the diaphragm 14. For example, the coverage structure 16 may include a conductive material, such as polycrystalline silicon. Alternately, the coverage structure 16 may include a dielectric material, such as silicon nitride, but the present disclosure is not limited thereto.

As shown in FIG. 1A, in some embodiments, the MEMS structure 10 further includes a pillar 17 disposed between the backplate 13 and the diaphragm 14. In more detail, the pillar 17 may be in direct contact with the backplate 13 (e.g., the conductive layer 131) and the diaphragm 14. For example, the pillar 17 may include insulating material, such as silicon oxide or the like, but the present disclosure is not limited thereto.

In some embodiments, the pillar 17 is disposed on the center of the diaphragm 14 and the center of the backplate 13, but the present disclosure is not limited thereto.

Figure 1C:
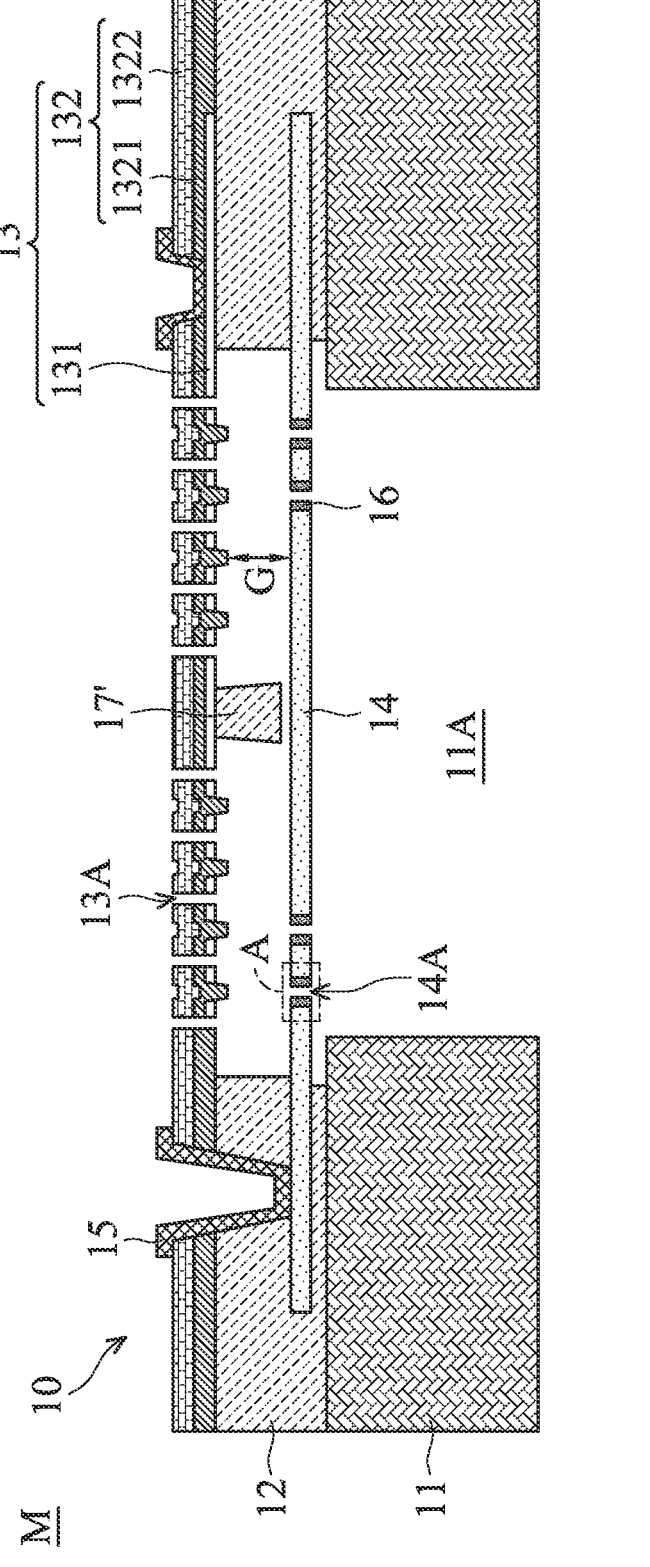
FIG. 1C and FIG. 1D are other examples of the micro-electro-mechanical system (MEMS) microphone according to some embodiments of the present disclosure.
Figure 1D:
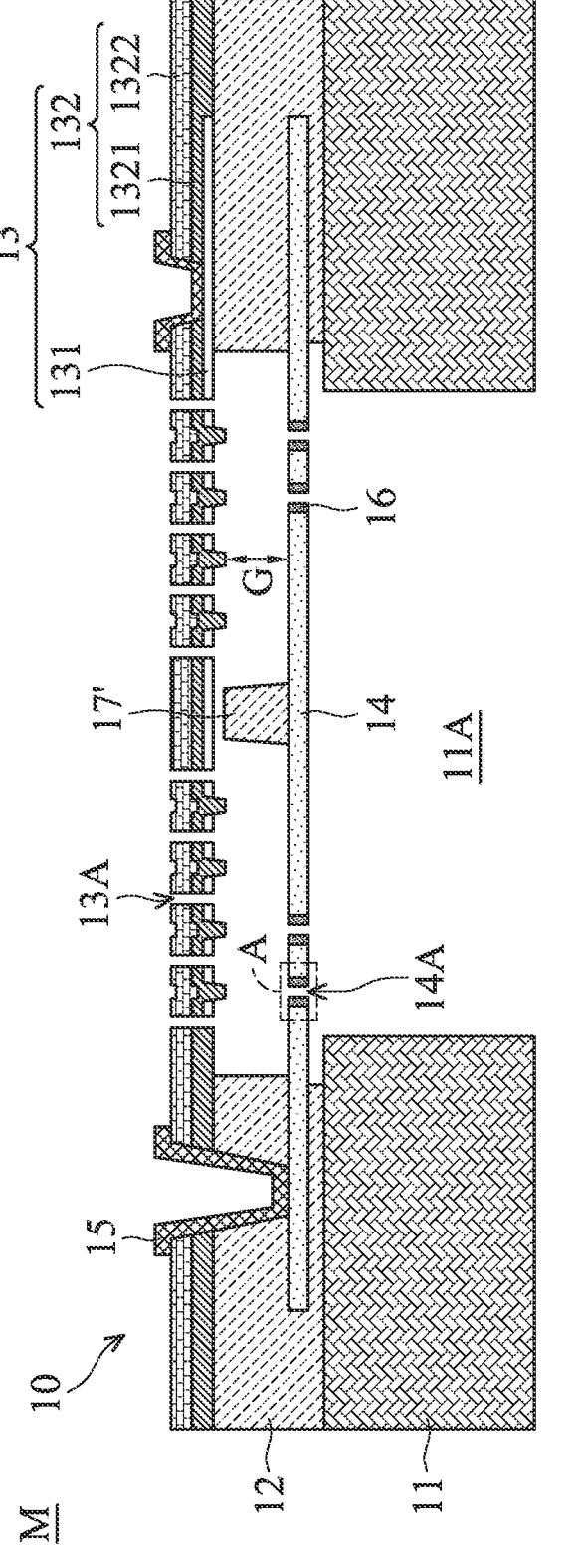

FIG. 1C and FIG. 1D are other examples of the micro-electro-mechanical system (MEMS) microphone M according to some embodiments of the present disclosure. In some embodiments, the pillar 17' and the diaphragm 14 (or the backplate 13) are separable. For example, the pillar 17' may be separated from the diaphragm 14 as shown in FIG. 1C. Alternately, the pillar 17' may be separated from the backplate 13 as show in FIG. 1D.

When variations in acoustic pressure (i.e., local pressure deviation from the ambient atmospheric pressure caused by sound waves) force the diaphragm 14 to deform correspondingly, the pillar 17' shown in FIG. 1C may touch the backplate 13, or the pillar 17' shown in FIG. 1D may touch the diaphragm 14, to limit the deformation of the diaphragm 14, but the present disclosure is not limited thereto.

FIG. 1B is a partial enlarged view of region A in FIG. 1A, which may show a portion of the diaphragm 14 and a portion of the coverage structure 16. Referring to FIG. 1B, in some embodiments, the coverage structure 16 forms a slit S in the corresponding ventilation hole 14. In some embodiments, the width WS of the slit S is smaller than about 0.4 μm.

For example, the ventilation hole 14A may have a width W14A of about 0.66 μm, and the width W16 of the coverage structure 16 may be about 0.2 μm. That is, the coverage structure 16 may reduce the critical dimension of the slit S in the corresponding ventilation hole 14 to about 0.26 μm, which may increase the acoustic resistance, thereby enhancing the signal-to-noise ratio (SNR). Furthermore, the width WS of the slit S may reduce the variation size of fabrication, thereby decreasing the phase mismatching between MEMS microphones.

Figures 2A, 2B:
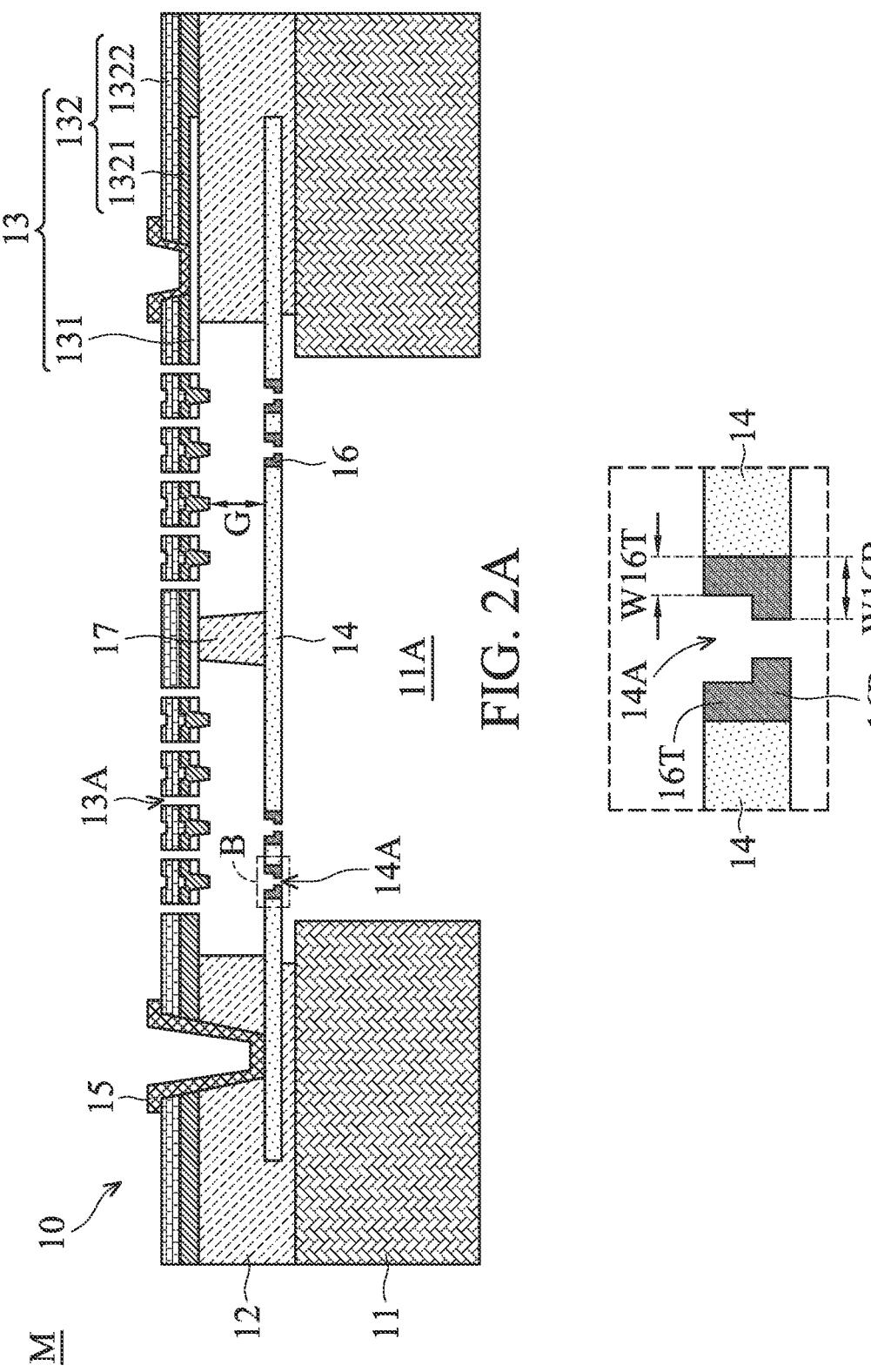
FIG. 2A is a partial cross-sectional view illustrating a micro-electro-mechanical system (MEMS) microphone according to some other embodiments of the present disclosure.
FIG. 2B is a partial enlarged view of region B in FIG. 2A, which may show a portion of the diaphragm and a portion of the coverage structure.

FIG. 2A is a partial cross-sectional view illustrating a micro-electro-mechanical system (MEMS) microphone M according to some other embodiments of the present disclosure. FIG. 2B is a partial enlarged view of region B in FIG. 2A, which may show a portion of the diaphragm 14 and a portion of the coverage structure 16. Similarly, some components of the MEMS microphone M (MEMS structure 10) have been omitted in FIG. 2A and FIG. 2B for sake of brevity.

Referring to FIG. 2A and FIG. 2B, in some embodiments, the width W16T of the top 16T of the coverage structure 16 is different from the width W16B of the bottom 16B of the coverage structure 16. For example, the width W16T of the top 16T of the coverage structure 16 is less than the width W16B of the bottom 16B of the coverage structure 16. That is, the coverage structure 16 may have a variable width.

Figure 3:
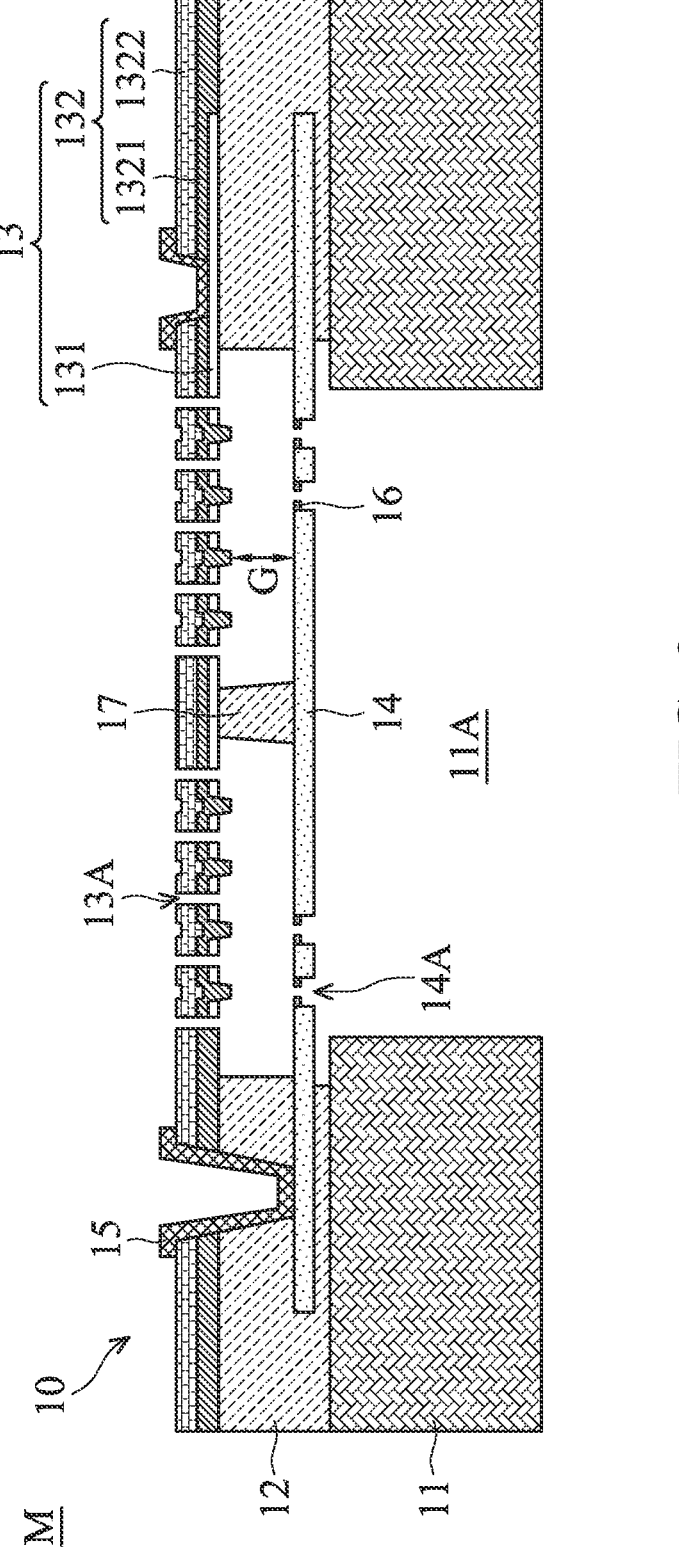
FIG. 3, FIG. 4, and FIG. 5 are partial cross-sectional views illustrating a micro-electro-mechanical system (MEMS) microphone according to some other embodiments of the present disclosure.
Figure 4:
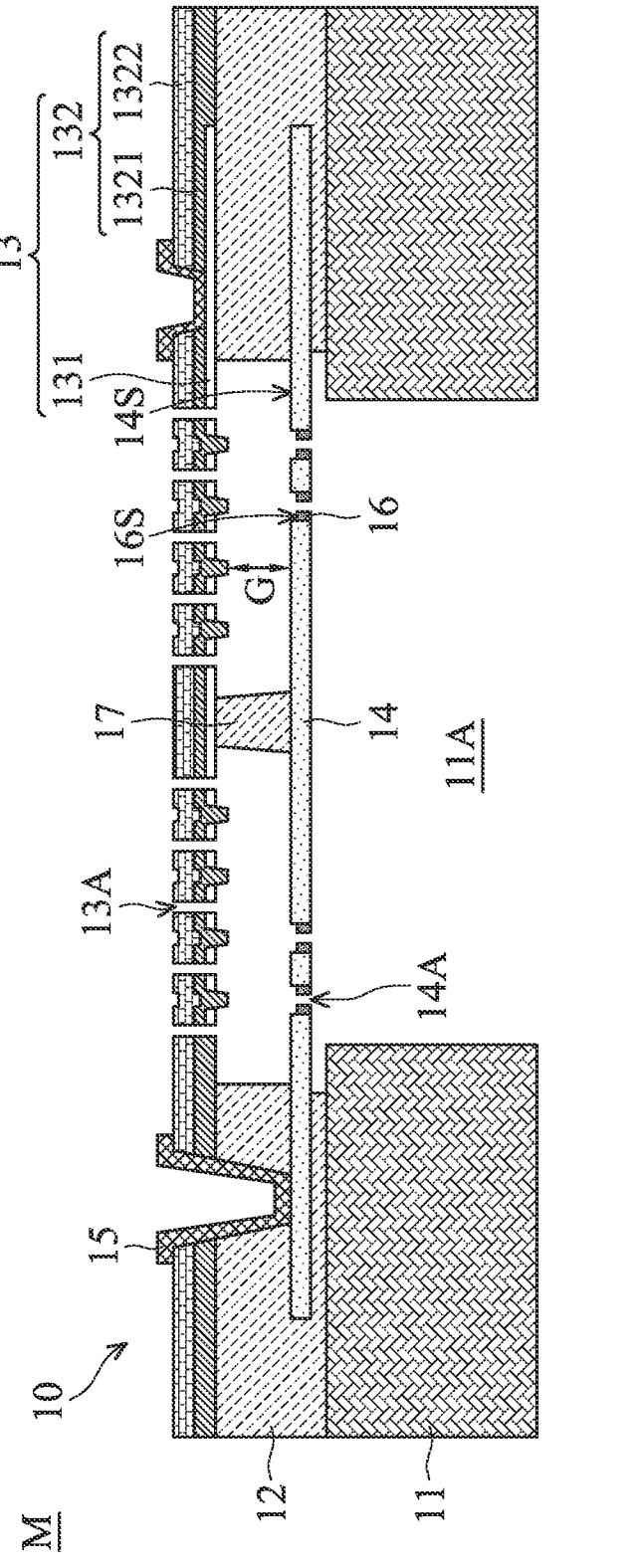
Figure 5:
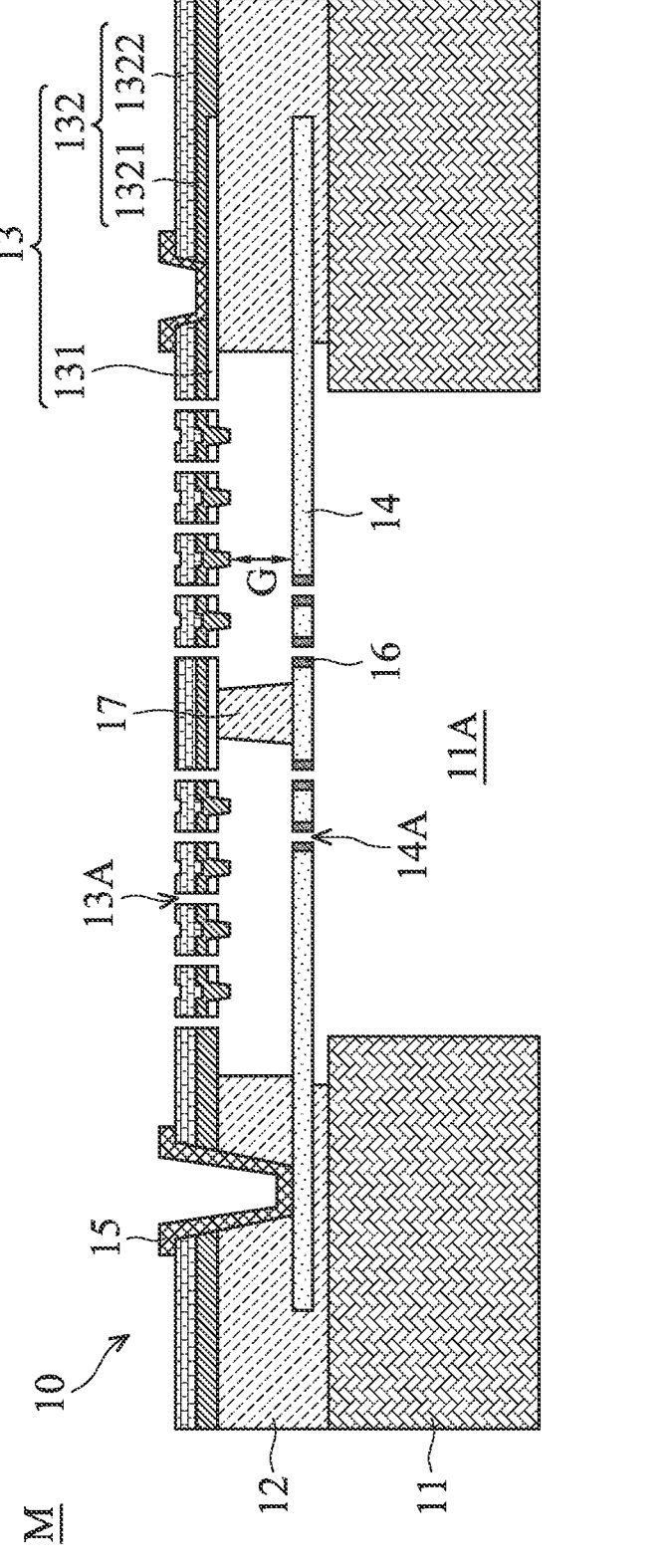

FIG. 3, FIG. 4, and FIG. 5 are partial cross-sectional views illustrating a micro-electro-mechanical system (MEMS) microphone M according to some other embodiments of the present disclosure. Similarly, some components of the MEMS microphone M (MEMS structure 10) have been omitted in FIG. 3, FIG. 4, and FIG. 5 for sake of brevity.

Referring to FIG. 3, in some embodiments, the coverage structure 16 covers a portion of the sidewall of the corresponding ventilation hole 14A, and exposes another portion of the sidewall of the corresponding ventilation hole 14A. For example, as shown in FIG. 3, the coverage structure 16 may be disposed near the top of the sidewall of the ventilation hole 14A and exposes the bottom of the sidewall of the ventilation hole 14A, but the present disclosure is not limited thereto.

Referring to FIG. 4, in some embodiments, the coverage structure 16 covers a portion of the sidewall of the corresponding ventilation hole 14A, and the top surface 16S of the coverage structure 16 is lower than the top surface 14S of the diaphragm 14.

In the foregoing embodiments, the ventilation holes 14A are arranged on (near) the periphery of the diaphragm 14, but the present disclosure is not limited thereto. Referring to FIG. 5, in some embodiments, the ventilation holes 14A are arranged adjacent to the center of the diaphragm 14 (i.e., near the pillar 17).

Figures 6A, 6B:
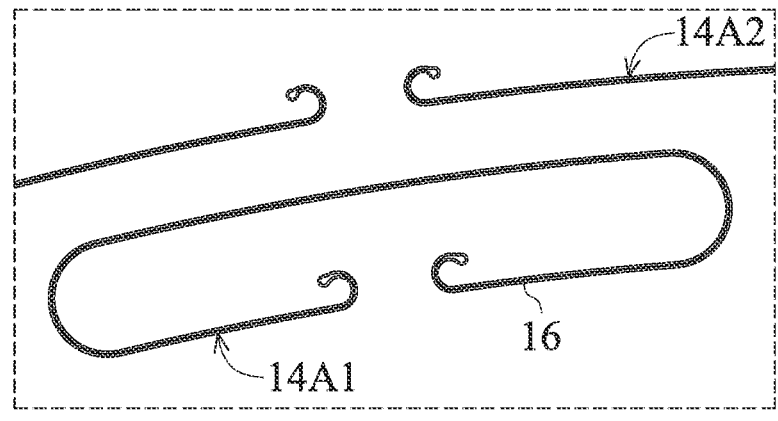
FIG. 6A is a partial top view illustrating the diaphragm (and the coverage structure) of the micro-electro-mechanical system (MEMS) microphone according to some embodiments of the present disclosure.
FIG. 6B is a partial enlarged view of region D in FIG. 6A.

FIG. 6A is a partial top view illustrating the diaphragm 14 (and the coverage structure 16) of the micro-electro-mechanical system (MEMS) microphone M according to some embodiments of the present disclosure. FIG. 6B is a partial enlarged view of region D in FIG. 6A. FIG. 6A and FIG. 6B may correspond to the diaphragm 14 (and the coverage structure 16) shown in FIG. 1A, FIG. 2A, FIG. 3, FIG. 4, or FIG. 5.

Referring to FIG. 6A, in some embodiments, the diaphragm 14 includes a number of ventilation holes 14A, and from a top view of the diaphragm 14 (e.g., FIG. 6A), the ventilation holes 14A are arranged in two ring shapes and surround the center C of the diaphragm 14.

As shown in FIG. 6A, in some embodiments, the ventilation holes 14A includes (or are divided into) first ventilation holes 14A1 and second ventilation holes 14A2, and the first ventilation holes 14A1 and the second ventilation holes 14A2 are arranged in a concentric manner. In some embodiments, the first ventilation holes 14A1 and the second ventilation holes 14A2 are staggered relative to the center C of the diaphragm 14. It should be noted that the ventilation holes 14A shown in FIG. 1A, FIG. 2A, FIG. 3, FIG. 4, or FIG. 5 may correspond to the first ventilation holes 14A1 and/or the second ventilation holes 14A2 shown in FIG. 6A and FIG. 6B.

As shown in FIG. 6A and FIG. 6B, in some embodiments, each first ventilation hole 14A1 and each second ventilation hole 14A2 are C-shaped. As shown in FIG. 6A, openings of the (C-shaped) second ventilation holes 14A2 may face away from the center C of the diaphragm 14, and openings of the (C-shaped) first ventilation holes 14A1 may face the center C of the diaphragm 14, but the present disclosure is not limited thereto. In more detail, the first ventilation holes 14A1 and the second ventilation holes 14A2 may have the different sizes, and the opening of each first ventilation hole 14A1 and the opening of the second ventilation hole 14A2 may face different directions, but the present disclosure is not limited thereto.

Moreover, as shown in FIG. 6A and FIG. 6B, in some embodiments, the first ventilation holes 14A1 and the second ventilation holes 14A2 are staggered relative to the center C of the diaphragm 14, and the coverage structure 16 is disposed sidewalls of both the second ventilation holes 14A2 and the first ventilation holes 14A1. As shown in FIG. 6A, in some embodiments, the first ventilation holes 14A1 are disposed between the center C of the diaphragm 14 and the second ventilation holes 14A2 in the radial direction of the diaphragm 14.

Figures 7A, 7B:
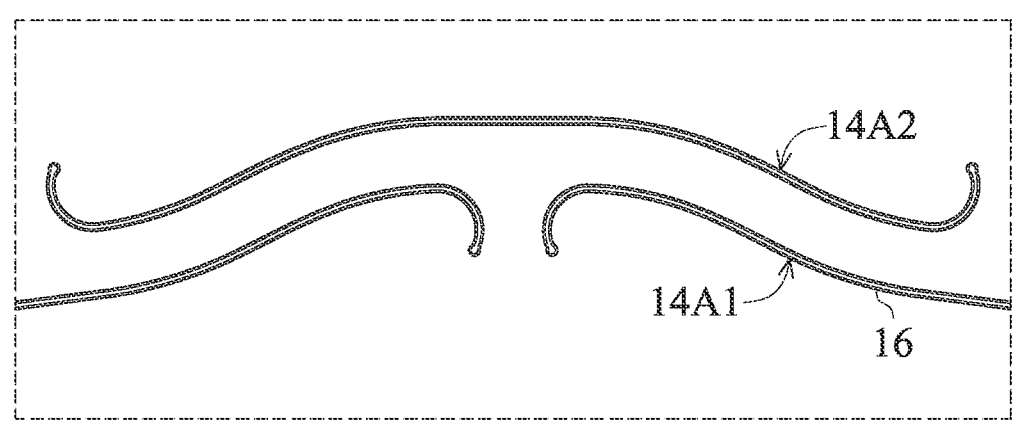
FIG. 7A is a partial top view illustrating the diaphragm (and the coverage structure) of the micro-electro-mechanical system (MEMS) microphone according to some other embodiments of the present disclosure.
FIG. 7B is a partial enlarged view of region E in FIG. 7A.

FIG. 7A is a partial top view illustrating the diaphragm 14 (and the coverage structure 16) of the micro-electro-mechanical system (MEMS) microphone M according to some other embodiments of the present disclosure. FIG. 7B is a partial enlarged view of region E in FIG. 7A. FIG. 7A and FIG. 7B may correspond to the diaphragm 14 (and the coverage structure 16) shown in FIG. 1A, FIG. 2A, FIG. 3, FIG. 4, or FIG. 5.

Referring to FIG. 7A and FIG. 7B, in some embodiments, each first ventilation hole 14A1 and each second ventilation hole 14A2 are curved. In some embodiments, the first ventilation holes 14A1 and the second ventilation holes 14A2 are staggered relative to the center C of the diaphragm 14. In this embodiment, each first ventilation hole 14A1 and each second ventilation hole 14A2 have the same size, and the number of first ventilation holes 14A is the same as the number of second ventilation holes 14B, but the present disclosure is not limited thereto.

Figures 8A, 8B:
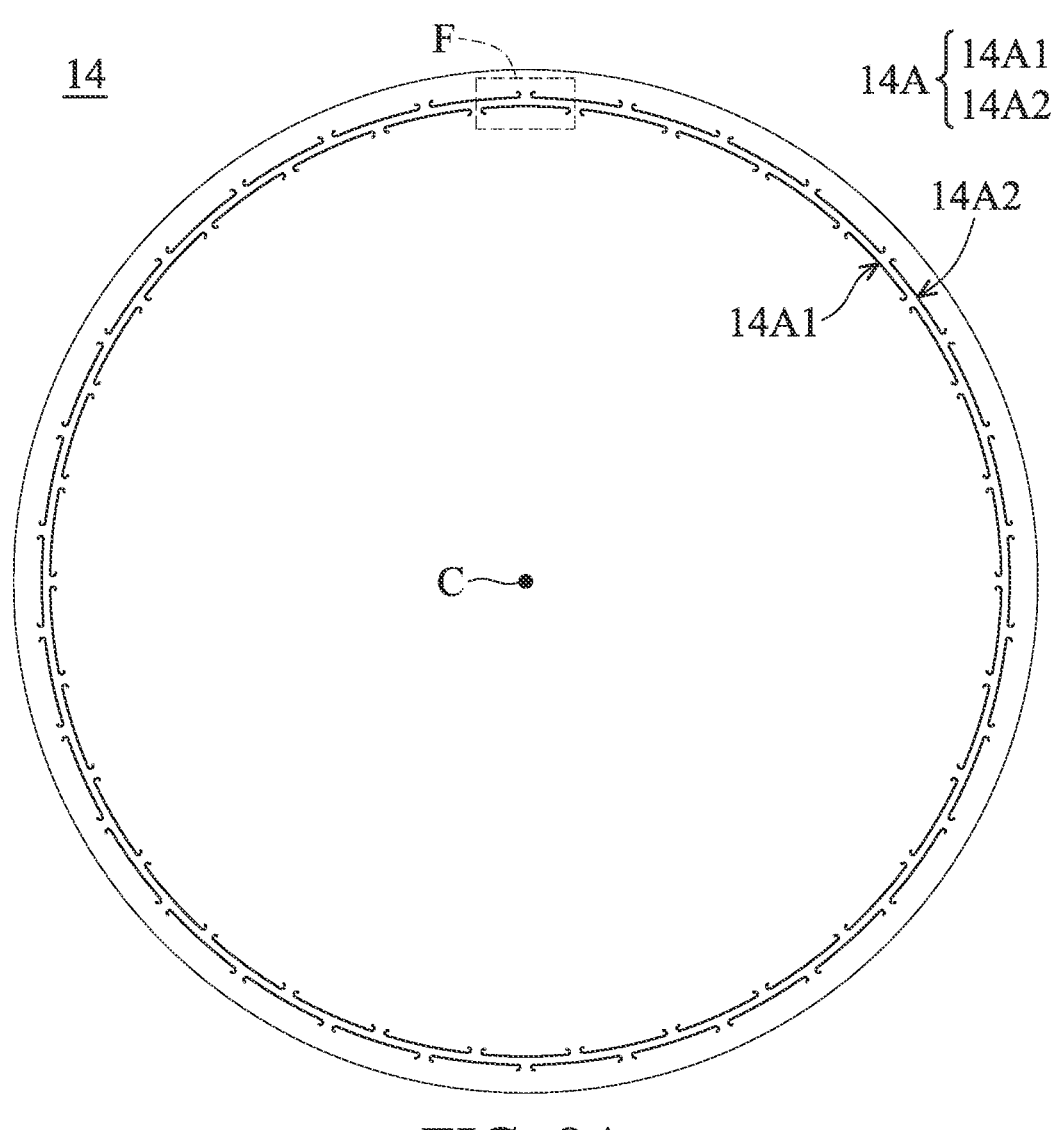
FIG. 8A is a partial top view illustrating the diaphragm (and the coverage structure) of the micro-electro-mechanical system (MEMS) microphone according to some other embodiments of the present disclosure.
FIG. 8B is a partial enlarged view of region F in FIG. 8A.

FIG. 8A is a partial top view illustrating the diaphragm 14 (and the coverage structure 16) of the micro-electro-mechanical system (MEMS) microphone M according to some other embodiments of the present disclosure. FIG. 8B is a partial enlarged view of region F in FIG. 8A. FIG. 8A and FIG. 8B may correspond to the diaphragm 14 (and the coverage structure 16) shown in FIG. 1A, FIG. 2A, FIG. 3, FIG. 4, or FIG. 5.

Referring to FIG. 8A and FIG. 8B, in some embodiments, each first ventilation hole 14A1 and each second ventilation hole 14A2 are C-shaped. In some embodiments, the first ventilation holes 14A1 and the second ventilation holes 14A2 are staggered relative to the center C of the diaphragm 14. In this embodiment, each first ventilation hole 14A1 and each second ventilation hole 14A2 have the same size, and the number of first ventilation holes 14A is the same as the number of second ventilation holes 14B, but the present disclosure is not limited thereto.

Figure 9A:
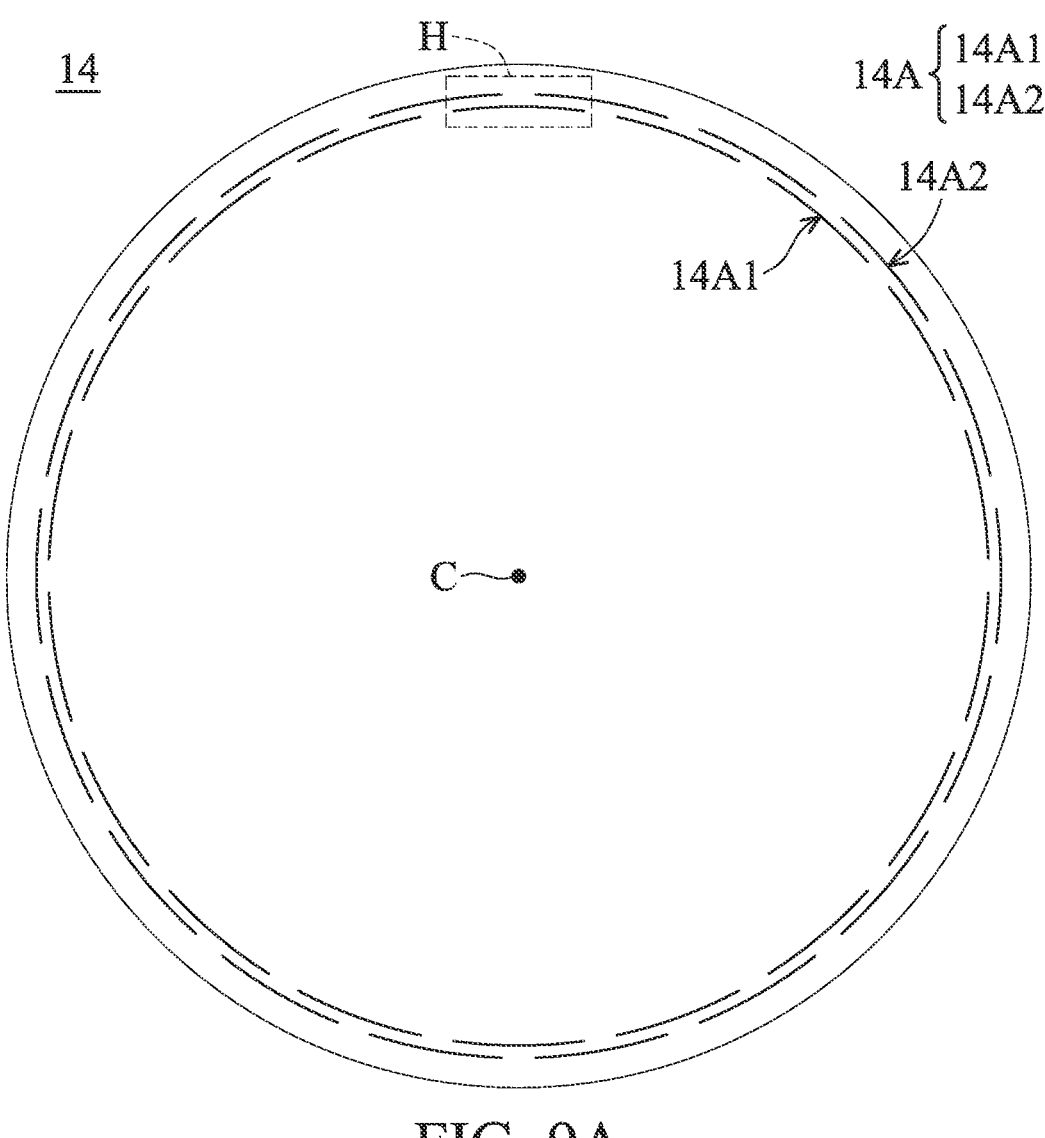
FIG. 9A is a partial top view illustrating the diaphragm (and the coverage structure) of the micro-electro-mechanical system (MEMS) microphone according to some other embodiments of the present disclosure.
Figure 9B:
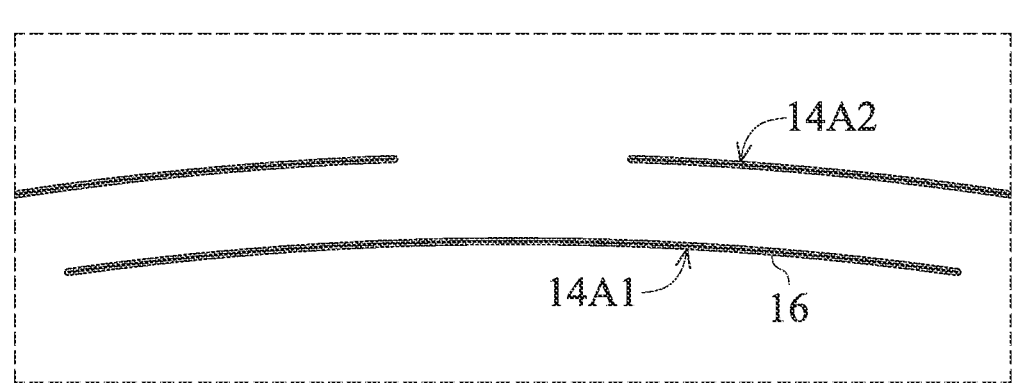
FIG. 9B is a partial enlarged view of region H in FIG. 9A.

FIG. 9A is a partial top view illustrating the diaphragm 14 (and the coverage structure 16) of the micro-electro-mechanical system (MEMS) microphone M according to some other embodiments of the present disclosure. FIG. 9B is a partial enlarged view of region H in FIG. 9A. FIG. 9A and FIG. 9B may correspond to the diaphragm 14 (and the coverage structure 16) shown in FIG. 1A, FIG. 2A, FIG. 3, FIG. 4, or FIG. 5.

Referring to FIG. 9A and FIG. 9B, in some embodiments, each first ventilation hole 14A1 and each second ventilation hole 14A2 are stripe-shaped. In some embodiments, the first ventilation holes 14A1 and the second ventilation holes 14A2 are staggered relative to the center C of the diaphragm 14. In this embodiment, each first ventilation hole 14A1 and each second ventilation hole 14A2 have the same size, and the number of first ventilation holes 14A is the same as the number of second ventilation holes 14B, but the present disclosure is not limited thereto.

Figure 10:
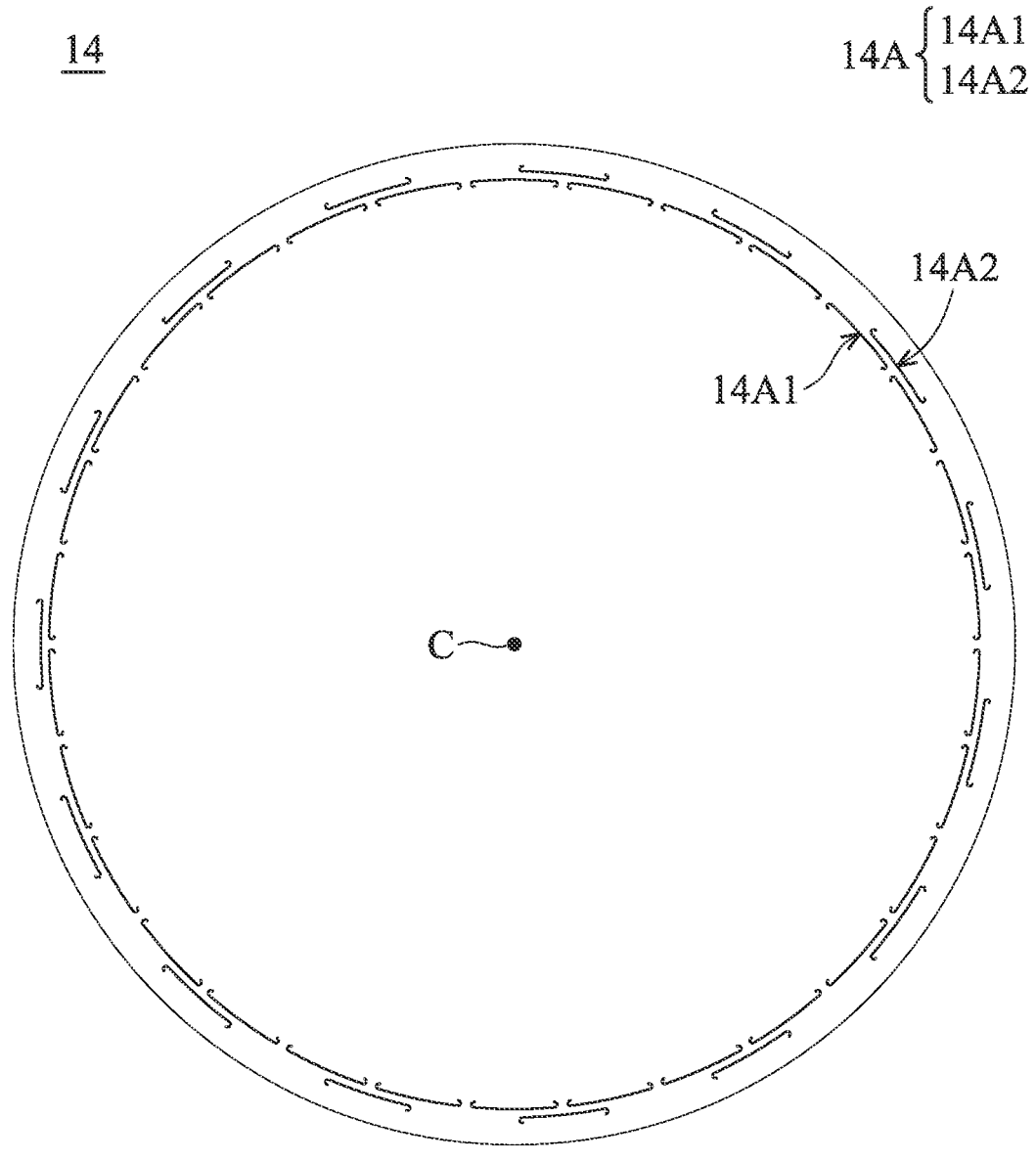
FIG. 10 is a partial top view illustrating the diaphragm (and the coverage structure) of the micro-electro-mechanical system (MEMS) microphone according to some other embodiments of the present disclosure.

FIG. 10 is a partial top view illustrating the diaphragm 14 (and the coverage structure 16) of the micro-electro-mechanical system (MEMS) microphone M according to some other embodiments of the present disclosure. FIG. 10 may correspond to the diaphragm 14 (and the coverage structure 16) shown in FIG. 1A, FIG. 2A, FIG. 3, FIG. 4, or FIG. 5.

Referring to FIG. 10, in some embodiments, each first ventilation hole 14A1 and each second ventilation hole 14A2 are C-shaped. In some embodiments, the first ventilation holes 14A1 and the second ventilation holes 14A2 are staggered relative to the center C of the diaphragm 14. In this embodiment, each first ventilation hole 14A1 and each second ventilation hole 14A2 have the same size, and the number of first ventilation holes 14A is different from the number of second ventilation holes 14B. For example, the number of first ventilation holes 14A is more than the number of second ventilation holes 14B, but the present disclosure is not limited thereto.

Figure 11:
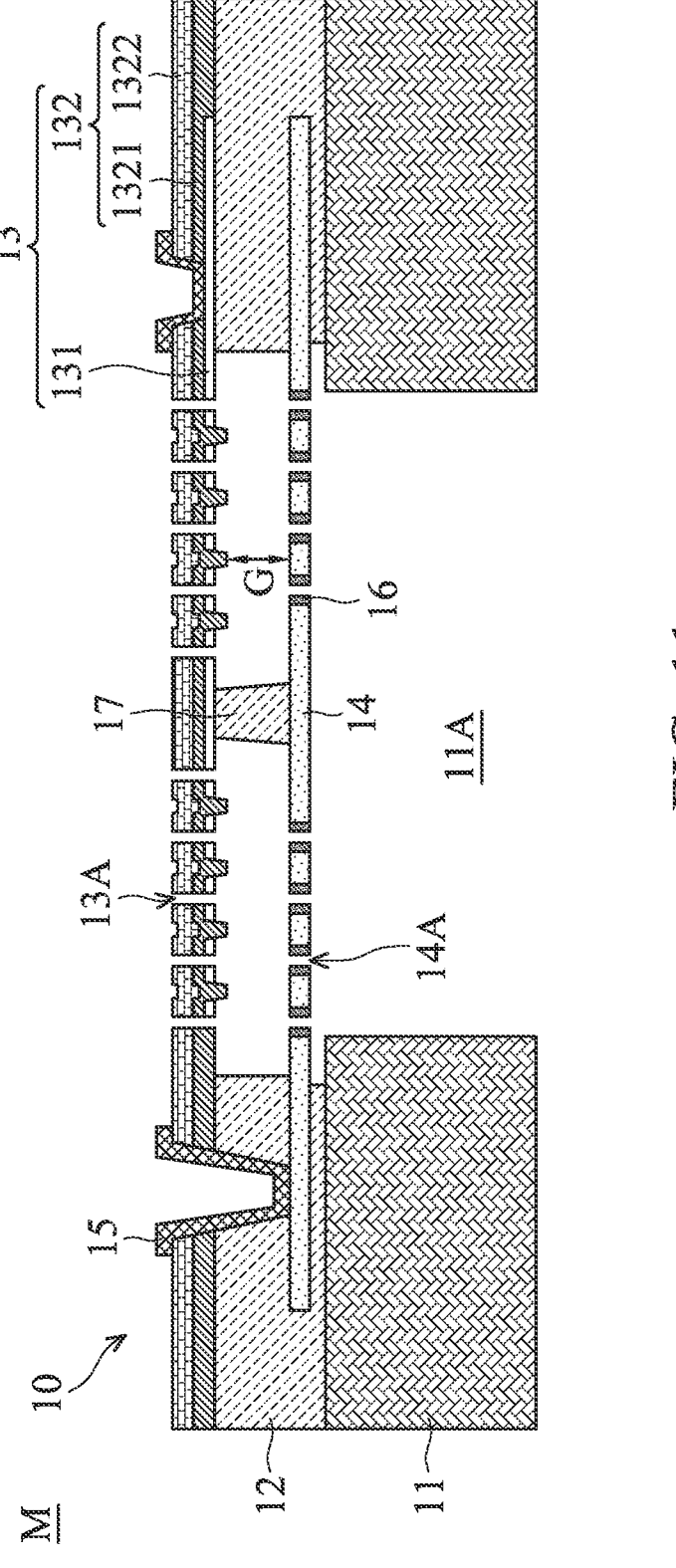
FIG. 11 is a partial cross-sectional view illustrating a micro-electro-mechanical system (MEMS) microphone according to some embodiments of the present disclosure.
Figure 12:
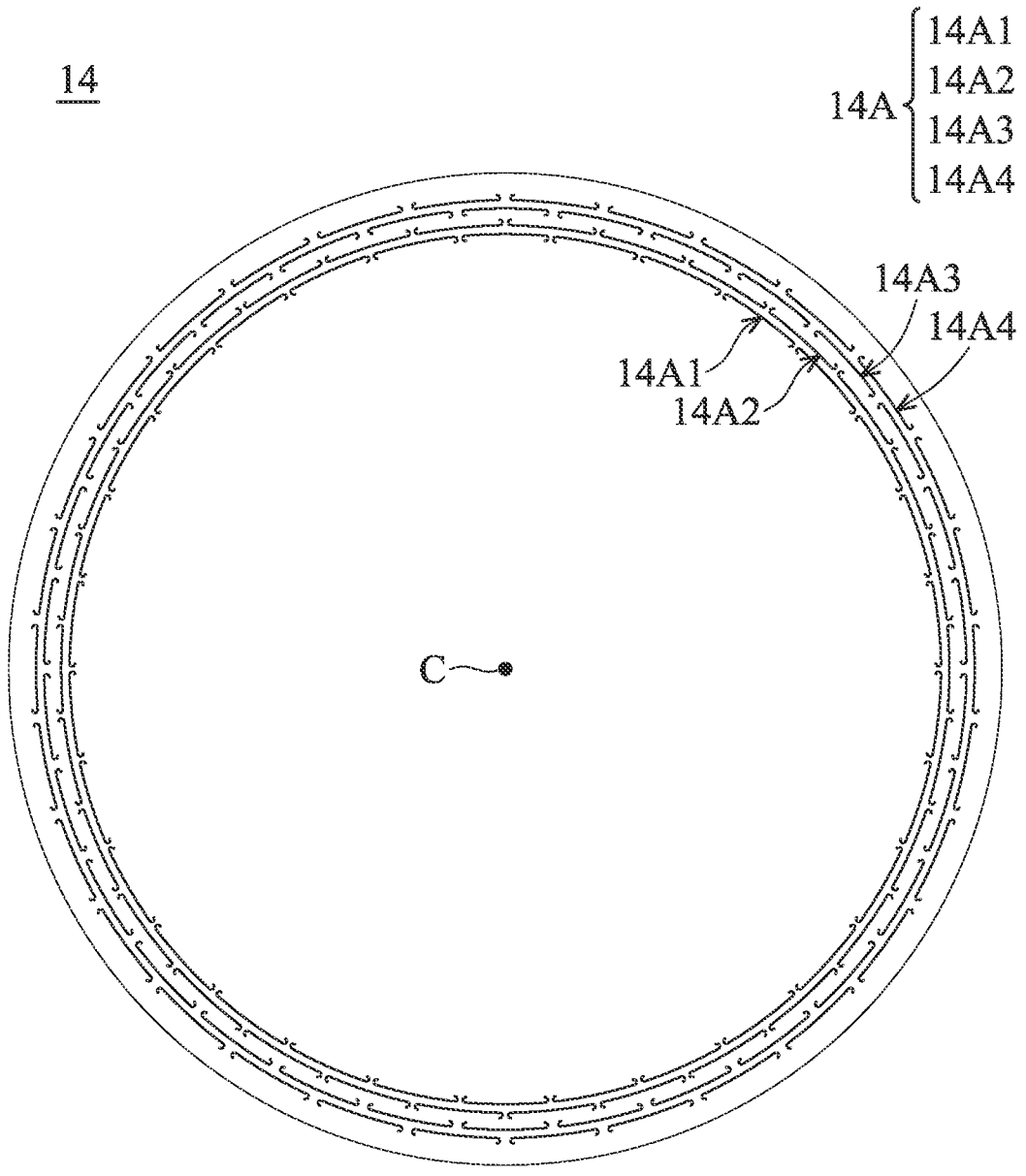
FIG. 12 is a partial top view illustrating the diaphragm (and the coverage structure) of the micro-electro-mechanical system (MEMS) microphone according to some embodiments of the present disclosure.

FIG. 11 is a partial cross-sectional view illustrating a micro-electro-mechanical system (MEMS) microphone M according to some embodiments of the present disclosure. FIG. 12 is a partial top view illustrating the diaphragm 14 (and the coverage structure 16) of the micro-electro-mechanical system (MEMS) microphone M according to some embodiments of the present disclosure. For example, FIG. 12 may correspond to the diaphragm 14 (and the coverage structure 16) shown in FIG. 11.

As shown in FIG. 12, in some embodiments, the ventilation holes 14A includes (or are divided into) first ventilation holes 14A1, second ventilation holes 14A2, third ventilation holes 14A3, and fourth ventilation holes 14A4, and the first ventilation holes 14A1, the second ventilation holes 14A2, the third ventilation holes 14A3, and fourth ventilation holes 14A4 are arranged in a concentric manner. It should be noted that the ventilation holes 14A shown in FIG. 11 may correspond to the first ventilation holes 14A1, the second ventilation holes 14A2, the third ventilation holes 14A3, and/or fourth ventilation holes 14A4 shown in FIG. 6A and FIG. 12.

As shown in FIG. 12, in some embodiments, the second ventilation holes 14A2 are disposed between the first ventilation holes 14A1 and the third ventilation holes 14A3 in the radial direction of the diaphragm 14, and the third ventilation holes 14A3 are disposed between the second ventilation holes 14A2 and the fourth ventilation holes 14A4 in the radial direction of the diaphragm 14.

Furthermore, as shown in FIG. 11, in some embodiments, the ventilation holes 14A are arranged adjacent to the center C of the diaphragm 14 and on the periphery of the diaphragm 14.

Figure 13:
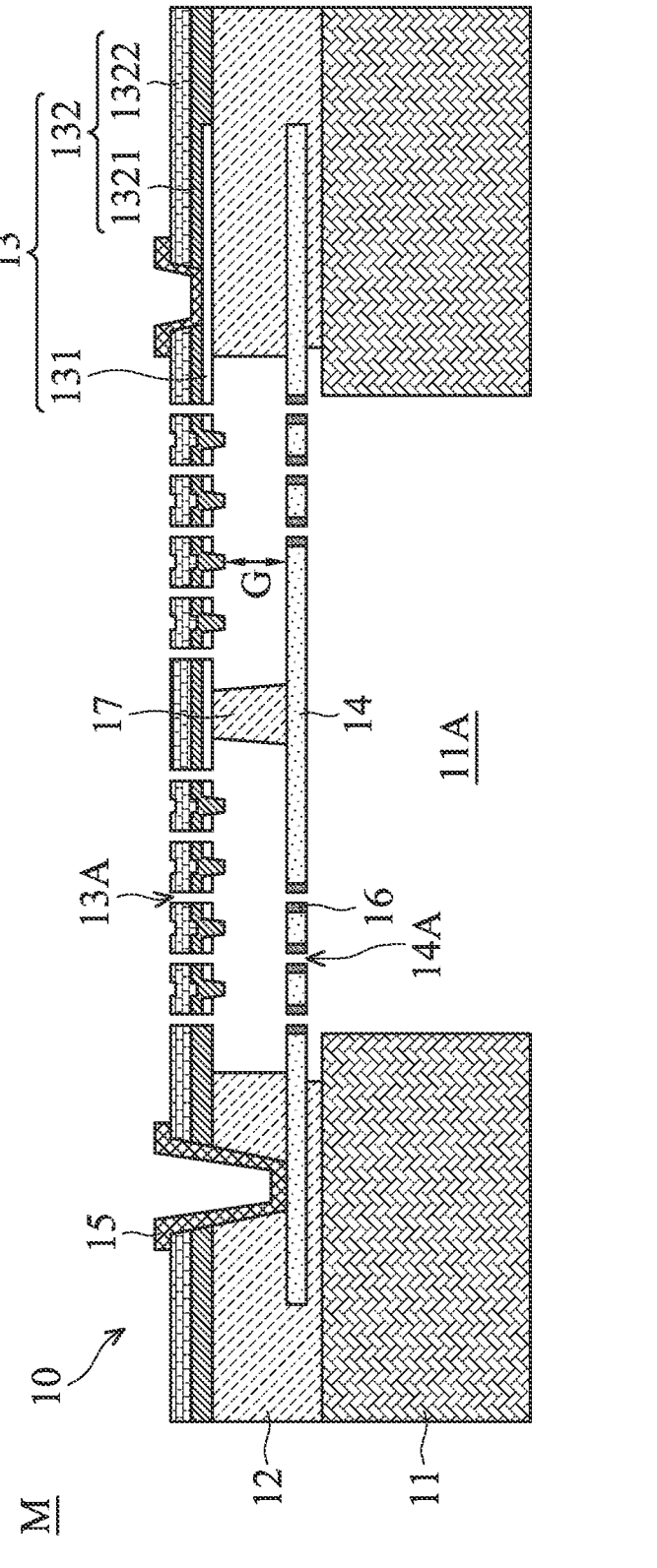
FIG. 13 is a partial cross-sectional view illustrating a micro-electro-mechanical system (MEMS) microphone according to some other embodiments of the present disclosure.

FIG. 13 is a partial cross-sectional view illustrating a micro-electro-mechanical system (MEMS) microphone M according to some other embodiments of the present disclosure. Referring to FIG. 13, the MEMS structure 10 has a similar structure to the MEMS structure 10 shown in FIG. 11. The main difference is that from a cross-sectional view of the MEMS structure 10, the number of ventilation holes 14A shown in FIG. 13 is different from the number of ventilation holes 14A shown in FIG. 11.

As noted above, in the embodiments of the present disclosure, since the MEMS structure includes a coverage structure disposed on the sidewall of at least one ventilation hole, the coverage structure may reduce the critical dimension of the ventilation hole (e.g., slit), which may increase the acoustic resistance, thereby enhancing the signal-to-noise ratio (SNR). Furthermore, the width of the slit may reduce the variation size of fabrication, thereby decreasing the phase mismatching between MEMS microphones.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro-electro-mechanical system structure, comprising:

a substrate having an opening portion;

a backplate disposed on one side of the substrate and having acoustic holes;

a diaphragm disposed between the substrate and the backplate, extending across the opening portion of the substrate, and comprising a plurality of ventilation holes, wherein an air gap is formed between the diaphragm and the backplate; and a plurality of coverage structures disposed on sidewalls of the plurality of ventilation holes, wherein the plurality of coverage structures is provided in a layer different from the diaphragm, wherein the plurality of coverage structures partially cover respective sidewalls of the plurality of ventilation holes such that portions of respective sidewalls of the diaphragm remain exposed, and in a vertical direction pointing from the substrate to the backplate, a top-most surface of the coverage structure is lower than a top surface of the diaphragm.

2. The micro-electro-mechanical system structure as claimed in claim 1, wherein each of the plurality of coverage structures forms a slit in the plurality of ventilation holes.

3. The micro-electro-mechanical system structure as claimed in claim 2, wherein a width of the slit is smaller than 0.4 μm.

4. The micro-electro-mechanical system structure as claimed in claim 1, wherein from a top view of the diaphragm, the plurality of ventilation holes are arranged in a plurality of ring shapes and surround the center of the diaphragm.

5. The micro-electro-mechanical system structure as claimed in claim 4, wherein the plurality of ventilation holes are divided into first ventilation holes and second ventilation holes arranged in a concentric manner.

6. The micro-electro-mechanical system structure as claimed in claim 5, wherein the first ventilation holes and the second ventilation holes are staggered relative to the center of the diaphragm.

7. The micro-electro-mechanical system structure as claimed in claim 5, wherein the first ventilation holes are disposed between the center of the diaphragm and the second ventilation holes in a radial direction of the diaphragm.

8. The micro-electro-mechanical system structure as claimed in claim 7, wherein the number of first ventilation holes is different from the number of second ventilation holes.

9. The micro-electro-mechanical system structure as claimed in claim 7, wherein each of first ventilation holes has a different size from each of second ventilation holes.

10. The micro-electro-mechanical system structure as claimed in claim 7, wherein the plurality of ventilation holes are further divided into third ventilation holes, and the second ventilation holes are disposed between the first ventilation holes and the third ventilation holes in the radial direction of the diaphragm.

11. The micro-electro-mechanical system structure as claimed in claim 4, wherein the plurality of ventilation holes are C-shaped, stripe-shaped, or curved.

12. The micro-electro-mechanical system structure as claimed in claim 1, wherein a width of each of the plurality of coverage structures is less than half of a thickness of the diaphragm.

13. The micro-electro-mechanical system structure as claimed in claim 4, wherein the plurality of ventilation holes are arranged adjacent to the center of the diaphragm or on a periphery of the diaphragm.

14. The micro-electro-mechanical system structure as claimed in claim 1, wherein each of the plurality of coverage structure covers a portion of the respective sidewall of the plurality of ventilation holes, and exposes another portion of the respective sidewall of the plurality of ventilation holes.

15. The micro-electro-mechanical system structure as claimed in claim 1, further comprising:

a pillar disposed between the backplate and the diaphragm.

16. The micro-electro-mechanical system structure as claimed in claim 15, wherein the pillar is disposed on a center of the diaphragm.

17. The micro-electro-mechanical system structure as claimed in claim 15, wherein the pillar and the diaphragm are separable.

18. The micro-electro-mechanical system structure as claimed in claim 1, wherein the plurality of coverage structures is made of a different material than the diaphragm.

* * * * *